United States Patent
Nakayama et al.

(10) Patent No.: US 10,293,454 B2
(45) Date of Patent: May 21, 2019

(54) POLISHING HEAD, POLISHING APPARATUS AND POLISHING METHOD

(71) Applicant: Toshiba Memory Corporation, Minato-ku (JP)

(72) Inventors: Takayuki Nakayama, Yokkaichi (JP); Takashi Watanabe, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 77 days.

(21) Appl. No.: 14/842,062

(22) Filed: Sep. 1, 2015

(65) Prior Publication Data

US 2016/0361792 A1 Dec. 15, 2016

Related U.S. Application Data

(60) Provisional application No. 62/174,115, filed on Jun. 11, 2015.

(51) Int. Cl.
| | | |
|---|---|---|
| *B24B 37/005* | (2012.01) | |
| *B24B 37/10* | (2012.01) | |
| *B24B 41/00* | (2006.01) | |
| *H01L 21/306* | (2006.01) | |
| *H01L 21/67* | (2006.01) | |

(52) U.S. Cl.
CPC ......... *B24B 37/005* (2013.01); *B24B 37/107* (2013.01); *B24B 41/002* (2013.01)

(58) Field of Classification Search
None
See application file for complete search history.

(56) References Cited

U.S. PATENT DOCUMENTS

| | | | |
|---|---|---|---|
| 7,066,785 B2 | 6/2006 | Park et al. | |
| 7,156,947 B2* | 1/2007 | Golzarian | B24B 37/013 156/345.12 |
| 2003/0019577 A1* | 1/2003 | Brown | B24B 1/005 156/345.14 |
| 2004/0137829 A1 | 7/2004 | Park et al. | |
| 2010/0080891 A1* | 4/2010 | Yoshimura | C23C 14/042 427/64 |

(Continued)

FOREIGN PATENT DOCUMENTS

| | | |
|---|---|---|
| JP | 2002-190461 | 7/2002 |
| JP | 2004-216548 | 8/2004 |

(Continued)

OTHER PUBLICATIONS

Machine Generated English Translation of JP 2010-274415 held to Yasuda Hozumi et al published Dec. 9, 2010.*

(Continued)

*Primary Examiner* — Sylvia MacArthur

(74) *Attorney, Agent, or Firm* — Oblon, McClelland, Maier & Neustadt, L.L.P.

(57) ABSTRACT

In one embodiment, a polishing head includes an elastic film configured to form pressure rooms to which a pressure fluid is fed, and configured to press a substrate onto a polishing surface with a fluid pressure of the pressure fluid. The head further includes a first magnetic generator provided above a partition wall that separates the pressure rooms. The head further includes a second magnetic generator configured to form at least a portion of the partition wall or provided below the partition wall.

14 Claims, 8 Drawing Sheets

(56) References Cited

U.S. PATENT DOCUMENTS

| | | | | |
|---|---|---|---|---|
| 2013/0052916 A1* | 2/2013 | David | ................... | B24B 37/013 |
| | | | | 451/5 |
| 2013/0324012 A1* | 12/2013 | Fukushima | ........... | B24B 37/005 |
| | | | | 451/1 |
| 2014/0273766 A1* | 9/2014 | Chang | ................... | B24B 37/042 |
| | | | | 451/59 |
| 2014/0302676 A1* | 10/2014 | Miyazaki | .............. | B24B 37/345 |
| | | | | 438/692 |
| 2015/0133038 A1* | 5/2015 | Yamaki | ................... | B24B 37/32 |
| | | | | 451/59 |

FOREIGN PATENT DOCUMENTS

| | | |
|---|---|---|
| JP | 4538805 | 9/2010 |
| JP | 2010-274415 | 12/2010 |
| JP | 2014-004675 | 1/2014 |
| JP | 2014-018933 | 2/2014 |

OTHER PUBLICATIONS

Machine Generated English Translation of JP 2004-216548 held to Park et al published Aug. 5, 2004.*

Article entitled "Rubber coated magnets" found at the link: https://supermagnetman.com/collections/rubber-coated-magnets. Publishing date unknown.*

* cited by examiner

POLISHING HEAD, POLISHING APPARATUS AND POLISHING METHOD

CROSS REFERENCE TO RELATED APPLICATION

This application is based upon and claims the benefit of priority from the prior U.S. Provisional Patent Application No. 62/174,115 filed on Jun. 11, 2015, the entire contents of which are incorporated herein by reference.

FIELD

Embodiments described herein relate to a polishing head, a polishing apparatus and a polishing method.

BACKGROUND

When a semiconductor device is manufactured, a film on a substrate is often polished to planarize the film or make the film thinner. Such a polishing process is performed, for example, by a chemical mechanical polishing (CMP) apparatus. However, in a case of manufacturing the semiconductor device that has a large vertical dimension such as a 3-D memory, there is a problem that it is difficult to planarize a concave portion formed in the film on the substrate and having a large area by the CMP apparatus. In this case, although the flatness of the film can be improved by using a hard pad as the polishing pad, the film is excessively polished or is not sufficiently polished near a partition wall between pressure rooms in the polishing head, which deteriorates in-plane uniformity of the thickness of the film. Therefore, there is a need for a polishing technique that can improve the in-plane uniformity of the thickness of a polishing target film.

DETAILED DESCRIPTION

Embodiments will now be explained with reference to the accompanying drawings.

In one embodiment, a polishing head includes an elastic film configured to form pressure rooms to which a pressure fluid is fed, and configured to press a substrate onto a polishing surface with a fluid pressure of the pressure fluid. The head further includes a first magnetic generator provided above a partition wall that separates the pressure rooms. The head further includes a second magnetic generator configured to form at least a portion of the partition wall or provided below the partition wall.

First Embodiment

Figure 1:
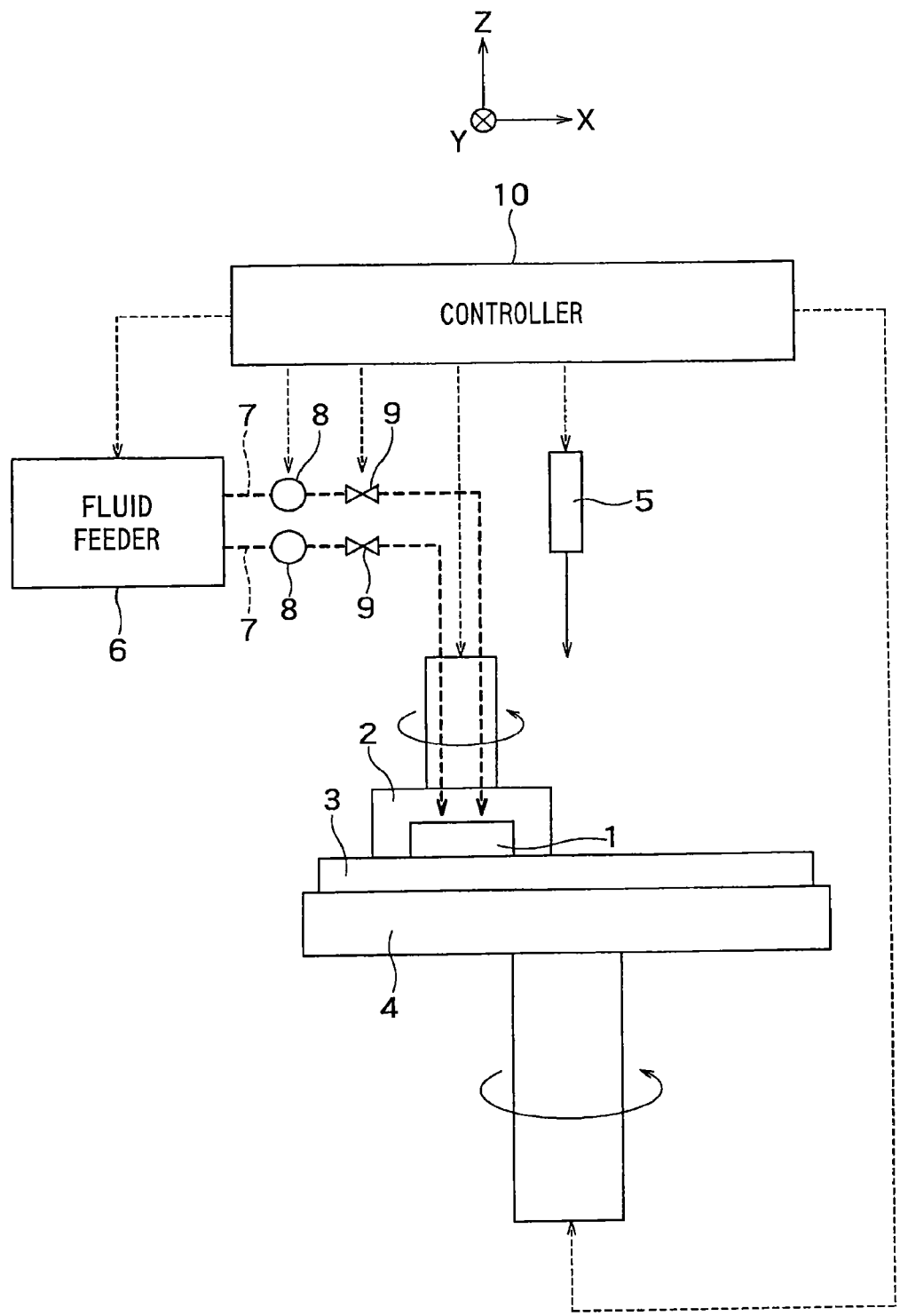
FIG. 1 is a cross-sectional view illustrating a structure of a polishing apparatus of a first embodiment.

FIG. 1 is a cross-sectional view illustrating a structure of a polishing apparatus of a first embodiment.

The polishing apparatus in FIG. 1 is a CMP apparatus that polishes a wafer (substrate) 1 by CMP. The polishing apparatus in FIG. 1 includes a polishing head 2, a polishing pad 3, a polishing table 4, a slurry feeder 5, a fluid feeder 6, flow channels 7, pressure regulators 8, on-off valves 9 and a controller 10.

FIG. 1 illustrates an X-direction and a Y-direction that are parallel to an installation surface of the polishing apparatus and perpendicular to each other, and a Z-direction that is perpendicular to the installation surface of the polishing apparatus. In this specification, the +Z-direction is regarded as an upward direction and the −Z-direction is regarded as a downward direction. For example, positional relation between the wafer 1 and the polishing pad 3 is expressed as that the polishing pad 3 is positioned below the wafer 1. The −Z-direction of the present embodiment may coincide with the direction of gravity or may not coincide with the direction of gravity.

The polishing head 2 retains the wafer 1 that is a polishing target, and the polishing table 4 retains the polishing pad 3 that is a polishing member. The polishing apparatus rotates the wafer 1 with the polishing head 2, rotates the polishing pad 3 with the polishing table 4, and feeds slurry onto a polishing surface (upper face) of the polishing pad 3 from the slurry feeder 5. Also, the polishing apparatus presses the wafer 1 onto the polishing surface of the polishing pad 3 with the polishing head 2. Thereby, a surface (lower face) of the wafer 1 is polished with the polishing pad 3.

The fluid feeder 6 feeds a pressure fluid for pressing the wafer 1 onto the polishing surface to the polishing head 2 via the flow channels 7. An example of the pressure fluid is compressed air. A pressure regulator 8 on each flow channel 7 is used for adjusting a fluid pressure of the pressure fluid. An on-off valve 9 on each flow channel 7 is used for opening and closing each flow channel 7. The polishing head 2 presses the wafer 1 onto the polishing surface with the fluid pressure of the pressure fluid from the fluid feeder 6.

The number of the flow channels 7 may be three or more. Moreover, the number of the pressure regulators 8 may be three or more, and the number of the on-off valves 9 may be three or more. Examples of such flow channels 7, pressure regulators 8 and on-off valves 9 are mentioned later. In the present embodiment, one pressure regulator 8 and one on-off valve 9 are provided on each flow channel 7.

The controller 10 controls various kinds of operation of the polishing apparatus. For example, the controller 10 controls operation of the polishing head 2, operation of the polishing table 4, feeding of the slurry from the slurry feeder 5, feeding of the pressure fluid from the fluid feeder 6, adjustment of the fluid pressure by the pressure regulators 8, opening/closing of the on-off valves 9 and the like.

Figure 2A:
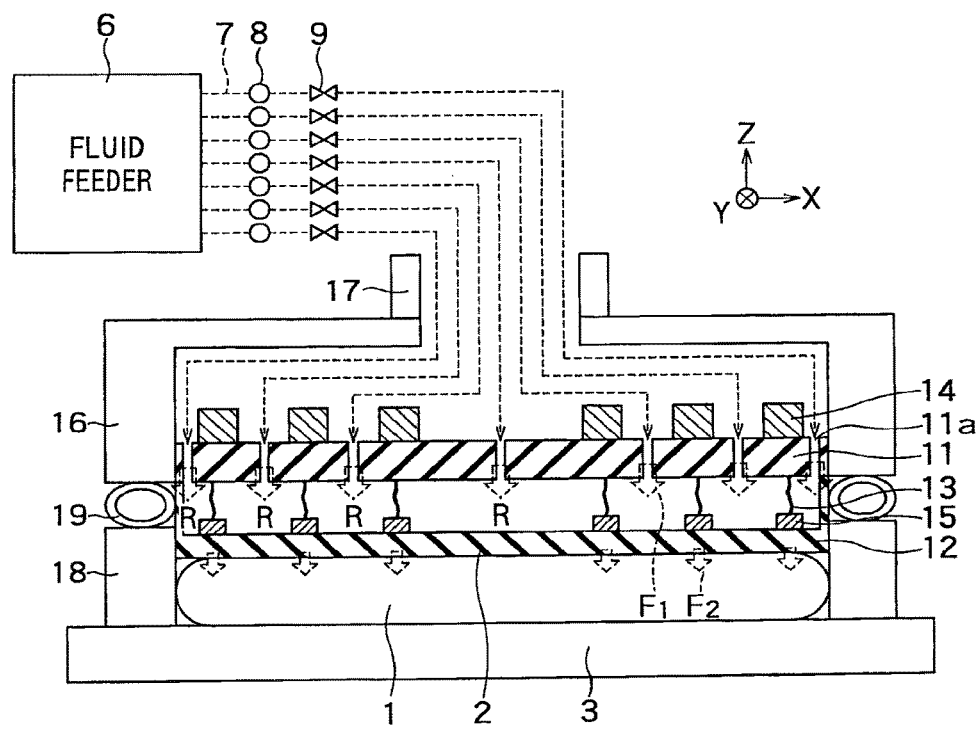
FIGS. 2A to 2C are cross-sectional views illustrating a structure of a polishing head of the first embodiment.
Figure 2B:
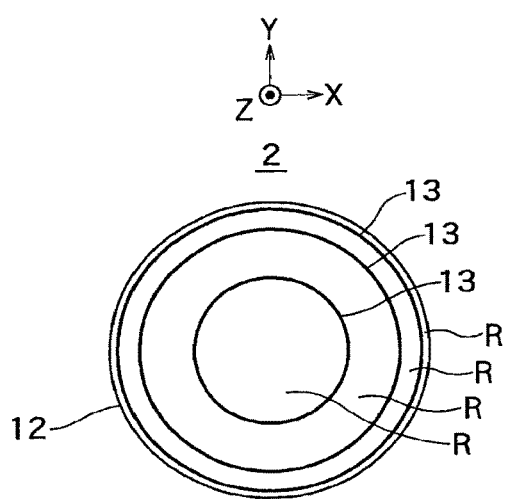
Figure 2C:
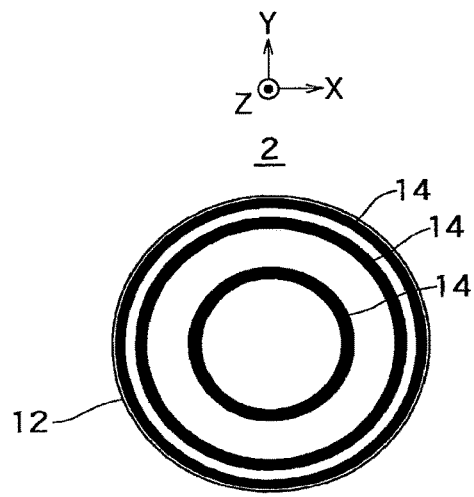

FIGS. 2A to 2C are cross-sectional views illustrating a structure of the polishing head 2 of the first embodiment. Hereafter, the structure of the polishing head 2 is described mainly with reference to FIG. 2A. In this description, FIGS. 2B and 2C are also properly referred to.

As illustrated in FIG. 2A, the polishing head 2 of the present embodiment includes a top ring body 11, a membrane 12, elastic partition walls 13, electromagnets 14, permanent magnets 15, a top ring 16, a top ring shaft 17, a retainer ring 18 and a retainer room 19. The top ring body 11 is an example of a pressure room formation member. The membrane 12 is an example of an elastic film. Each electromagnet 14 is an example of a first magnetic generator. Each permanent magnet 15 is an example of a second magnetic generator.

The top ring body 11 and the membrane 12 form pressure rooms R to which the pressure fluid is fed. The top ring body 11 is positioned above the pressure rooms R and has holes 11a for feeding the pressure fluid into the pressure rooms R. The top ring body 11 of the present embodiment is formed of a resin such as plastics. A planar shape of the top ring body 11 is, for example, circular. The membrane 12 is positioned below the pressure rooms R and is in contact with the wafer 1. The membrane 12 of the present embodiment is formed of an elastic member such as rubber.

The fluid feeder 6 feeds the pressure fluid to the holes 11a through the flow channels 7 to feed the pressure fluid into the pressure rooms R. The membrane 12 then presses the wafer 1 onto the polishing surface with the fluid pressure of the pressure fluid. Thereby, the surface of the wafer 1 is polished with the polishing pad 3. Sign $F_1$ denotes the fluid pressure of the pressure fluid. The controller 10 (FIG. 1) can adjust a pressing pressure on the wafer 1 with each pressure room R by adjusting the fluid pressure of the pressure fluid fed to each pressure room R.

The elastic partition walls 13 form, together with the permanent magnets 15, partition walls that separate the pressure rooms R from one another. Specifically, the elastic partition walls 13 form upper portions of the partition walls, and the permanent magnets 15 form lower portions of the partition walls. An elastic partition wall 13 and a permanent magnet 15 of each partition wall are caused to adhere to each other with an adhesive. Moreover, the elastic partition walls 13 are caused to adhere to the top ring body 11, and the permanent magnets 15 are caused to adhere to the membrane 12. The elastic partition walls 13 of the present embodiment are formed of elastic members such as rubber. Meanwhile, the permanent magnets 15 of the present embodiment may be elastic magnets such as rubber magnets or may be any other magnets.

FIG. 2B illustrates an XY-cross section of the elastic partition walls 13. Each elastic partition wall 13 of the present embodiment has a ring shape having an inner circumferential face and an outer circumferential face. Specifically, cross-sectional shapes of the inner circumferential face and the outer circumferential face are circular. Moreover, the elastic partition walls 13 of the present embodiment have shapes of concentric rings. The same holds true for the permanent magnets 15. Therefore, cross-sectional shapes of the pressure rooms R of the present embodiment are circular or annular.

The electromagnets 14 are attached onto an upper face of the top ring body 11 and disposed above the elastic partition walls 13 via the top ring body 11. In the present embodiment, one elastic partition wall 13, one electromagnet 14 and one permanent magnet 15 correspond to one another on a one-on-one basis. Magnetic force acts between the corresponding electromagnet 14 and permanent magnet 15, and the elastic partition wall 13 between these is compressed or expanded with this magnetic force. Sign $F_2$ denotes the magnetic force acting between the corresponding electromagnet 14 and permanent magnet 15. The controller 10 (FIG. 1) can adjust a direction and a magnitude of the magnetic force by controlling a direction and a magnitude of a current applied to each electromagnet 14, and can adjust the pressing pressure of each partition wall with this magnetic force.

FIG. 2C illustrates an XY-cross section of the electromagnets 14. Each electromagnet 14 of the present embodiment has a ring shape having an inner circumferential face and an outer circumferential face. Specifically, cross-sectional shapes of the inner circumferential face and the outer circumferential face are circular. Moreover, the electromagnets 14 of the present embodiment have shapes of concentric rings. The center of the ring shapes of the electromagnets 14 is positioned at a position of overlapping with the center of the ring shapes of the elastic partition walls 13 and the permanent magnets 15.

The top ring 16 is attached to the top ring body 11. The top ring shaft 17 is attached to the top ring 16. The controller 10 (FIG. 1) can move and rotate the polishing head 2 by driving the top ring shaft 17. The flow channels 7 of the present embodiment are arranged inside the top ring 16 and the top ring shaft 17.

The retainer ring 18 is attached to the top ring 16 via the retainer room 19. The retainer room 19 contains the pressure fluid fed from the fluid feeder 6 through an unshown flow channel. The wafer 1 of the present embodiment is retained inside the retainer ring 18. When the surface of the wafer 1 is polished, the retainer ring 18 presses the polishing surface of the polishing pad 3 with an action of the retainer room 19.

While each pressure room R of the present embodiment is connected to one or two holes 11a, any number of holes 11a may be provided to each pressure room R. Moreover, while the holes 11a in FIG. 2A are drawn in the same cross section for convenience of illustration, the holes 11a may be positioned in different cross sections from one another.

Figure 3:
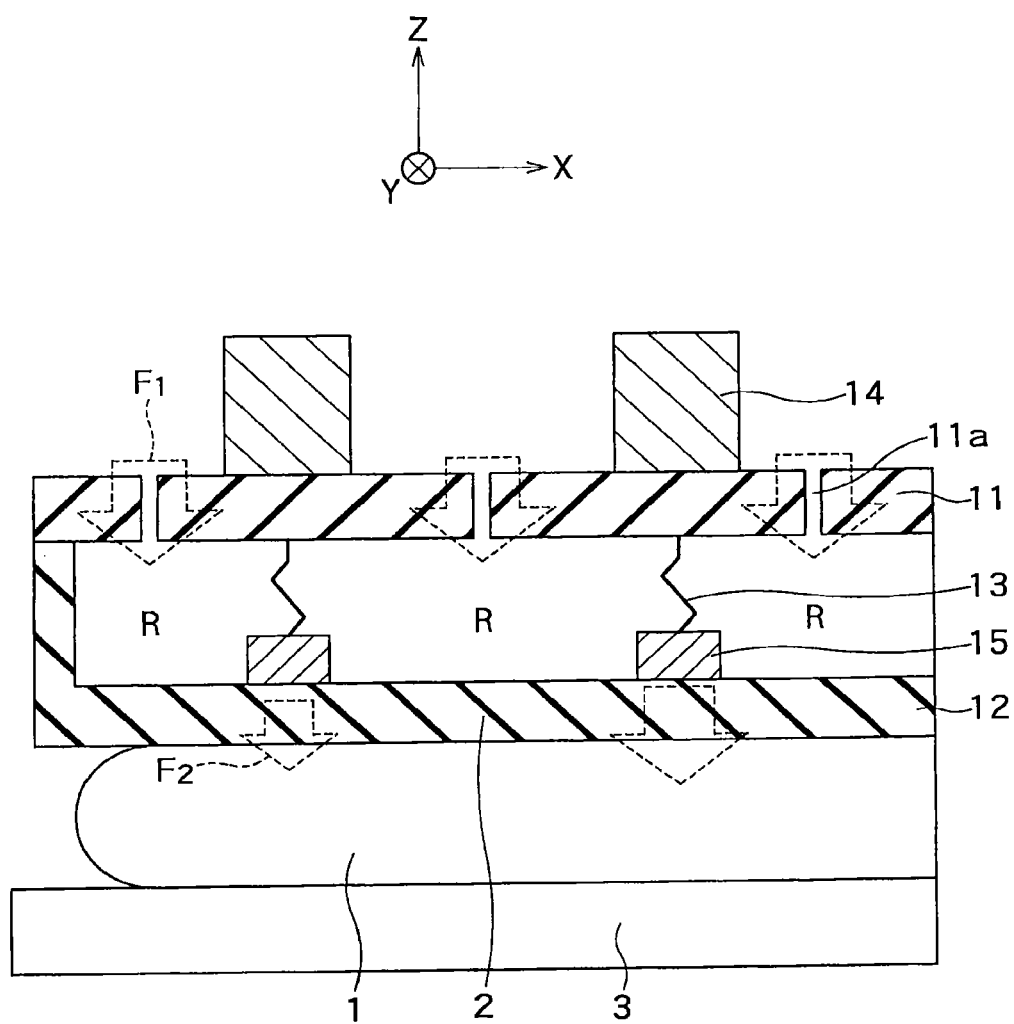
FIG. 3 is a cross-sectional view illustrating the structure of the polishing head of the first embodiment.

FIG. 3 is a cross-sectional view illustrating the structure of the polishing head 2 of the first embodiment. FIG. 3 corresponds to an expanded cross-sectional view of FIG. 2A. In FIG. 3, the top ring 16, the top ring shaft 17, the retainer ring 18 and the retainer room 19 are omitted from illustration.

The polishing head 2 (membrane 12) of the present embodiment presses the wafer 1 with the fluid pressure $F_1$ of the pressure fluid and the magnetic force $F_2$ between the electromagnets 14 and the permanent magnets 15. Therefore, the pressing pressure with which the polishing head 2 presses the wafer 1 is determined based on the fluid pressure $F_1$ and the magnetic force $F_2$. The controller 10 of the present embodiment controls the pressing pressure mainly with the fluid pressure $F_1$, and in addition to this, finely adjusts the pressing pressure with the magnetic force $F_2$. The details are described with reference to FIGS. 4A and 4B.

Figure 4A:
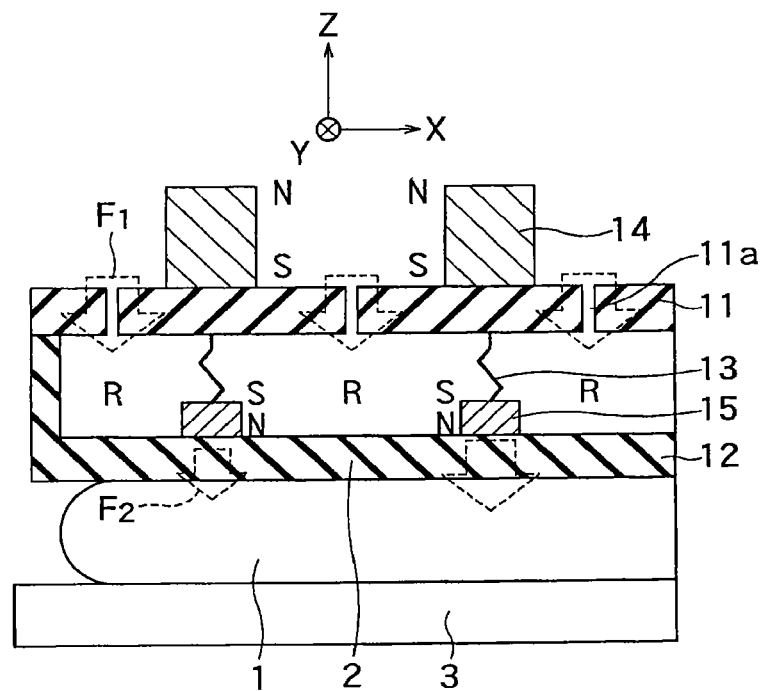
FIGS. 4A and 4B are cross-sectional views for explaining an example of operation of the polishing head of the first embodiment.
Figure 4B:
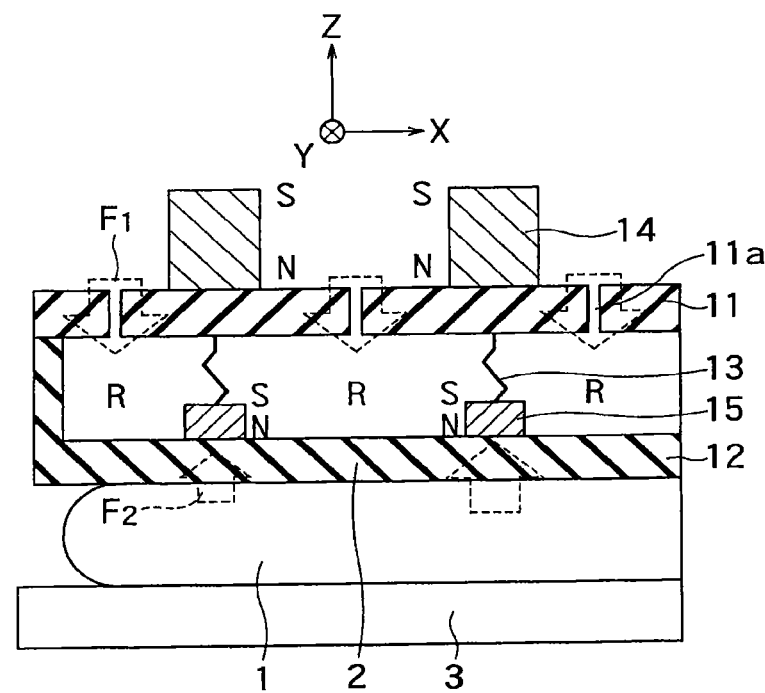

FIGS. 4A and 4B are cross-sectional views for explaining an example of operation of the polishing head 2 of the first embodiment.

FIG. 4A illustrates polarities of the permanent magnets 15. In the present embodiment, all of the permanent magnets 15 of the polishing head 2 have magnetizations oriented to the same direction. Specifically, each permanent magnet 15 has an N-pole in its lower portion and an S-pole in its upper portion, and thereby all of the permanent magnets 15 have the magnetizations oriented to the +Z-direction.

FIG. 4A further illustrates polarities of the electromagnets 14. In FIG. 4A, all of the electromagnets 14 have magnetizations oriented to the −Z-direction, where each electromagnet 14 has an N-pole in its upper portion and an S-pole in its lower portion. Therefore, repulsive force acts between the corresponding electromagnet 14 and permanent magnet 15 as the magnetic force $F_2$. As a result, the magnetic force $F_2$ in FIG. 4A can increase the pressing pressure for pressing the wafer 1.

On the other hand, all of the electromagnets 14 in FIG. 4B have magnetizations oriented to the +Z-direction, where each electromagnet 14 has an N-pole in its lower portion and an S-pole in its upper portion. Therefore, attractive force acts between the corresponding electromagnet 14 and permanent magnet 15 as the magnetic force $F_2$. As a result, the magnetic force $F_2$ in FIG. 4B can reduce the pressing pressure for pressing the wafer 1.

Therefore, the controller 10 can set the magnetic force $F_2$ to be either repulsive force or attractive force by controlling the direction of the current applied to each electromagnet 14. Thereby, the controller 10 can either increase or reduce the pressing pressure. Moreover, the controller 10 can adjust the magnitude of the magnetic force $F_2$ by controlling the magnitude of the current applied to each electromagnet 14. Thereby, the controller 10 can adjust either an increasing amount or a reducing amount of the pressing pressure.

Therefore, according to the present embodiment, when a film formed on the wafer 1 is polished, in-plane uniformity of the thickness of the film can be improved. For example, in a case where the film is excessively polished at a certain place, the magnetic force $F_2$ near the place is set to be attractive force. Thereby, the pressing pressure at the place can be reduced and the polishing amount at the place can be reduced. On the other hand, in a case where the film is not sufficiently polished at a certain place, the magnetic force $F_2$ near the place is set to be repulsive force. Thereby, the pressing pressure at the place can be increased and the polishing amount at the place can be increased.

According to an experiment, the place where the film is excessively polished and the place where the film is not sufficiently polished are liable to arise near the partition walls. The reason can be considered as that portions in the membrane 12 near the partition walls are hardly deformed as compared with other portions in the membrane 12 and the pressing pressure based on the fluid pressure $F_1$ is liable to act thereon to a larger or smaller extent than on the other portions. Accordingly, the electromagnets 14 and the permanent magnets 15 of the present embodiment are disposed near the partition walls or in the partition walls. Therefore, according to the present embodiment, the pressing pressure near the partition walls can be effectively adjusted and the in-plane uniformity of the thickness of the film can be suppressed from deteriorating near the partition walls.

Moreover, the controller 10 of the present embodiment controls the pressing pressure mainly with the fluid pressure $F_1$, and in addition to this, finely adjusts the pressing pressure with the magnetic force $F_2$. Such control and adjustment lead to the following advantages.

First, it is generally difficult to control the fluid pressure $F_1$ with higher precision as compared with the magnetic force $F_2$. Therefore, control of the pressing pressure only with the fluid pressure $F_1$ causes difficulty in high precision control of the in-plane uniformity of the thickness of the film. On the other hand, according to the present embodiment, the pressing pressure is controlled with the fluid pressure $F_1$ and the magnetic force $F_2$, and thereby the in-plane uniformity of the thickness of the film can be controlled with high precision.

Second, control of the pressing pressure only with the magnetic force $F_2$ causes increase in power consumption of the polishing apparatus. On the other hand, according to the present embodiment, the pressing pressure is controlled with the fluid pressure $F_1$ and the magnetic force $F_2$, and thereby the increase in power consumption of the polishing apparatus can be suppressed. Furthermore, according to the present embodiment, since the pressing pressure is controlled mainly with the fluid pressure $F_1$, and the magnetic force $F_2$ is used for finely adjusting the pressing pressure, the increase in power consumption of the polishing apparatus can be further suppressed.

As described above, the polishing apparatus of the present embodiment makes it possible, by controlling the pressing pressure with the fluid pressure $F_1$ and the magnetic force $F_2$, to improve the in-plane uniformity of the thickness of the film formed on the wafer 1 while the power consumption is suppressed from increasing.

The permanent magnets 15 of the present embodiment may have the magnetizations oriented to the same direction, or may have the magnetizations oriented to different directions. It is noted that the configuration of the magnetizations oriented to the same direction advantageously leads, for example, to easy control of the direction of the magnetic force $F_2$. The reason is that applying the currents in the same direction to the electromagnets 14 enables the magnetic force $F_2$ in the same direction to be acted on the partition walls.

Figure 5:
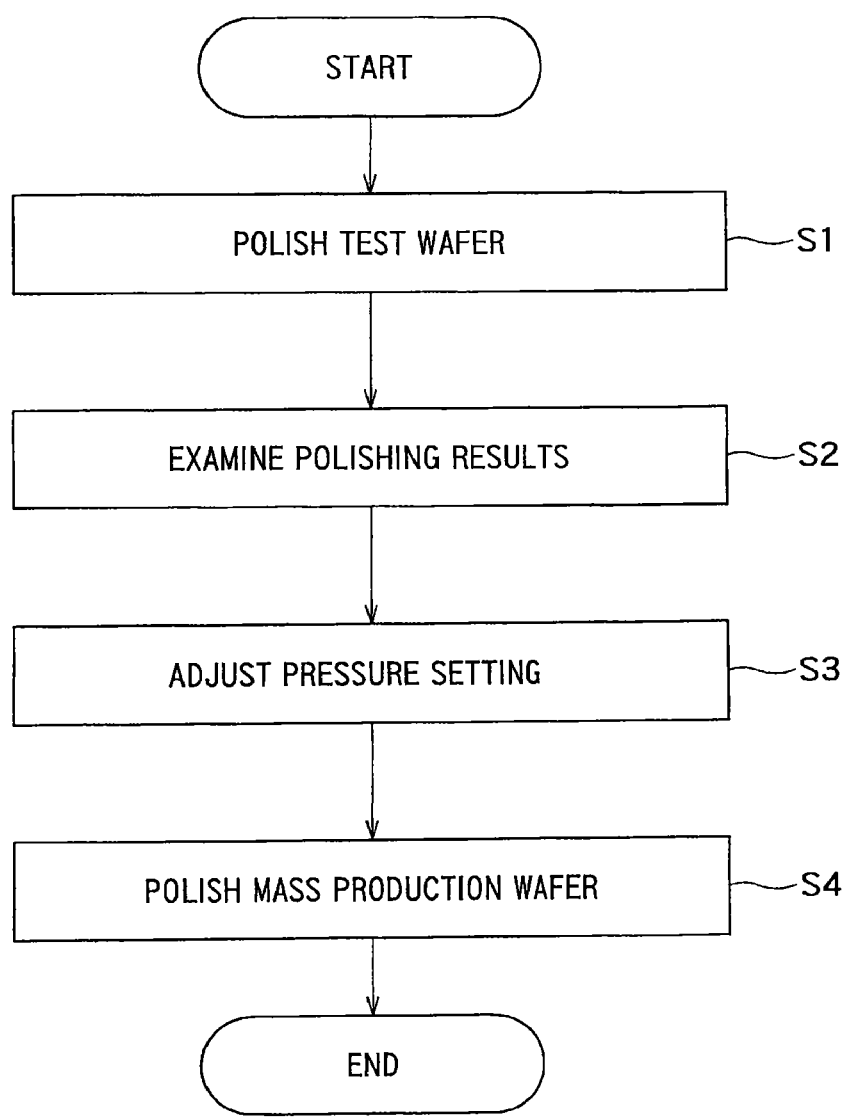
FIG. 5 is a flowchart illustrating an example of a polishing method of the first embodiment.

FIG. 5 is a flowchart illustrating an example of a polishing method of the first embodiment. The polishing method in FIG. 5 is performed using the polishing apparatus in FIG. 1.

First, a test wafer is set to the polishing head 2 as the wafer 1 and a surface of the test wafer is polished (step S1). In this stage, the pressing pressure on the test wafer may be controlled only with the fluid pressure $F_1$, or may be controlled with the fluid pressure $F_1$ and the magnetic force $F_2$. The test wafer is an example of a first substrate.

Next, the polishing results of the test wafer are examined (step S2). Specifically, the thickness of the film formed on the test wafer is measured, and a place where the film is excessively polished and a place where the film is not sufficiently polished are specified. The process in step S2 may be manually performed by a human using a measurement apparatus or may be automatically performed by a measurement apparatus.

Next, the pressure setting of the polishing head 2 is adjusted based on the polishing results of the test wafer (step S3). For example, in the case where the film is excessively polished at a certain place, the magnetic force $F_2$ near the place is set to be attractive force, or Increases the magnitude of the attractive force. Moreover, in the case where the film is not sufficiently polished at a certain place, the magnetic force $F_2$ near the place is set to be repulsive force, or increases the magnitude of the repulsive force. The adjustment results of the pressure setting of the polishing head 2 are stored in a storage device for the controller 10. In step S3, the pressure setting of the fluid pressure $F_1$ may be adjusted as well as those of the magnetic force $F_2$.

Next, a mass production wafer is set to the polishing head 2 as the wafer 1 and a surface of the mass production wafer is polished (step S4). In this stage, the pressing pressure on the mass production wafer is controlled based on the pressure setting stored in the storage device in step S3. In this way, the mass production wafer can be polished under the preferable pressure setting, and preferable semiconductor devices can be mass-produced. The mass production wafer is an example of a second substrate.

Instead of controlling the pressing pressure on the mass production wafer based on the polishing results of the test wafer, the polishing apparatus of the present embodiment may control the pressing pressure on the wafer 1 that is being polished, based on the measurement results of the polishing status of the wafer 1 that is being polished. For example, the polishing apparatus of the present embodiment may measure the thickness of the film on the wafer 1 by using an optical thickness measurement device during polishing the wafer 1, change the pressing pressure based on the measurement results, and continue the polishing of the wafer 1 at the pressing pressure after the change.

As described above, the polishing apparatus of the present embodiment includes the membrane 12 that presses the wafer 1 with the fluid pressure of the pressure fluid, the electromagnets 14 that are provided above the partition walls between the pressure rooms R, and the permanent magnets 15 that form the partition walls together with the elastic partition walls 13. Therefore, the present embodiment makes it possible, by controlling the pressing pressure on the wafer 1 with the fluid pressure and the magnetic force, to improve the in-plane uniformity of the thickness of the film formed on the wafer 1.

Second Embodiment

Figure 6:
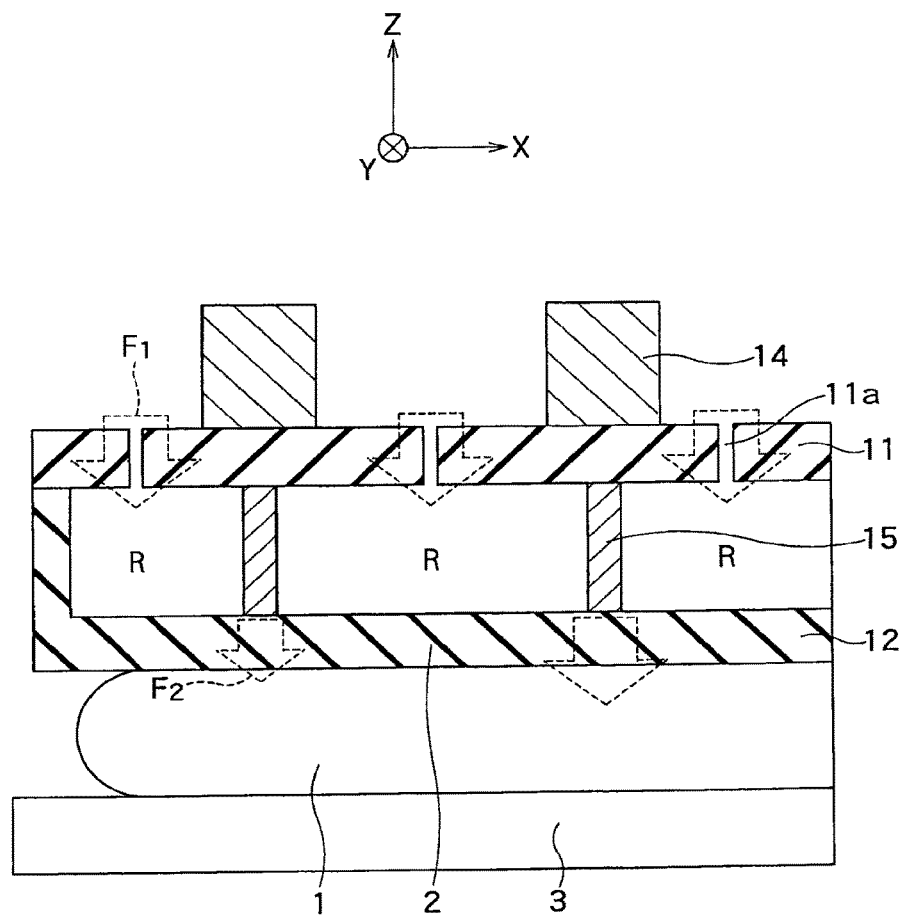
FIG. 6 is a cross-sectional view illustrating a structure of a polishing head of a second embodiment.

FIG. 6 is a cross-sectional view illustrating a structure of the polishing head 2 of a second embodiment.

Each partition wall of the first embodiment is formed of an elastic partition wall 13 and a permanent magnet 15. Meanwhile, each partition wall of the present embodiment is formed of a permanent magnet 15 only. The permanent magnet 15 of the present embodiment is an elastic magnet such as a rubber magnet. Therefore, the permanent magnet 15 of the present embodiment is compressed or expanded with the magnetic force $F_2$.

According to the present embodiment, the in-plane uniformity of the thickness of the film formed on the wafer 1 can be improved similarly to the first embodiment. The present embodiment has an advantage that the distance between the electromagnets 14 and the permanent magnets 15 is shorter as compared with that in the first embodiment, which enables larger magnetic force to be easily obtained. Meanwhile, the first embodiment has an advantage that a portion of each partition wall can be formed from an inexpensive elastic member.

Third Embodiment

Figure 7:
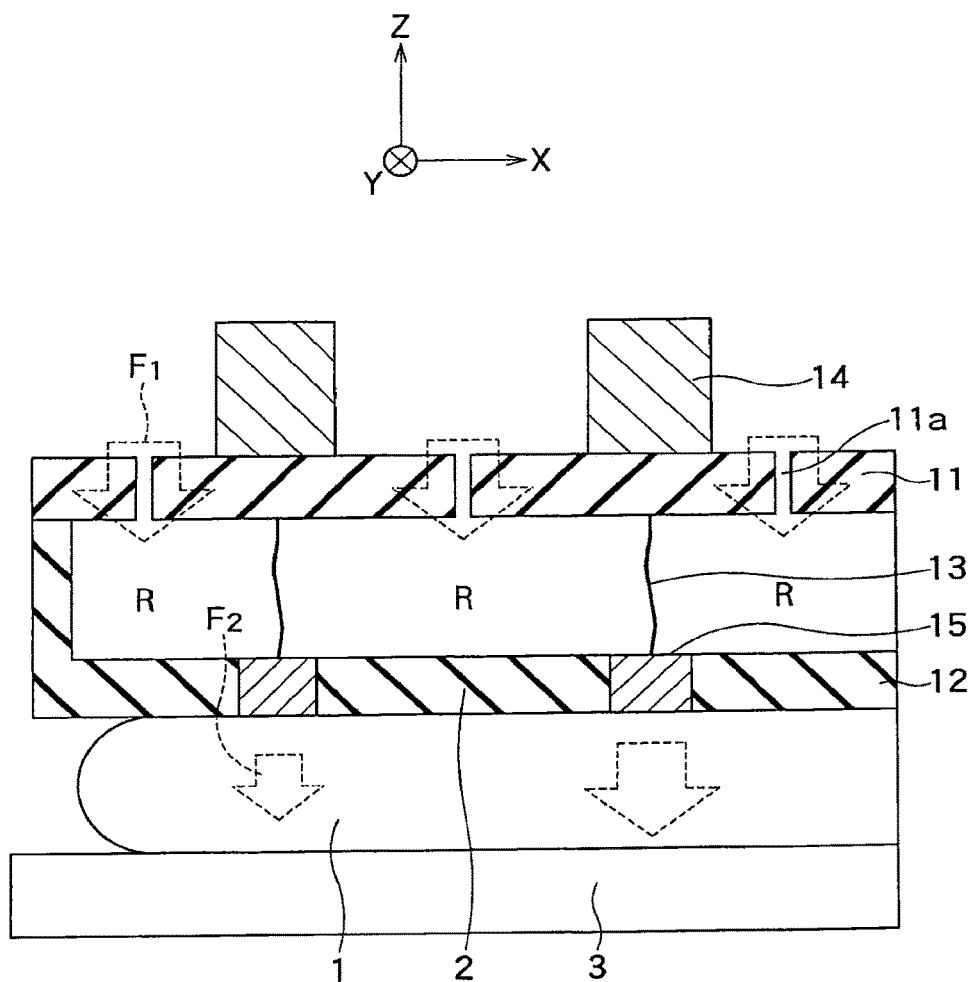
FIG. 7 is a cross-sectional view illustrating a structure of a polishing head of a third embodiment.

FIG. 7 is a cross-sectional view illustrating a structure of the polishing head 2 of a third embodiment.

Each partition wall of the present embodiment is formed of an elastic partition wall 13 only, and a permanent magnet 15 is provided in the membrane 12 below each partition wall. The permanent magnet 15 of the present embodiment is an elastic magnet such as a rubber magnet. Therefore, the permanent magnet 15 of the present embodiment can be deformed together with the membrane 12.

According to the present embodiment, the in-plane uniformity of the thickness of the film formed on the wafer 1 can be improved similarly to the first and second embodiments. Moreover, the present embodiment makes it possible, for example, to form the whole partition wall with an inexpensive elastic member.

Fourth Embodiment

Figure 8:
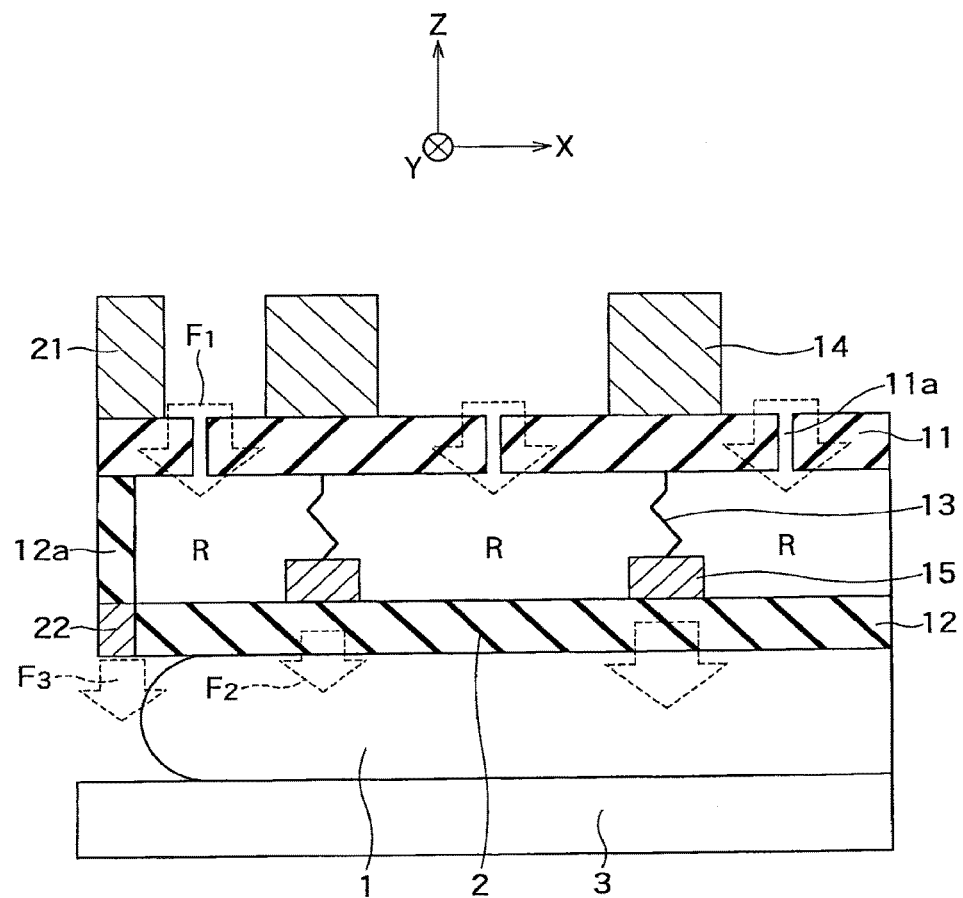
FIG. 8 is a cross-sectional view illustrating a structure of a polishing head of a fourth embodiment.

FIG. 8 is a cross-sectional view illustrating a structure of the polishing head 2 of a fourth embodiment.

In addition to the components of the polishing head 2 of the first embodiment, the polishing head 2 of the present embodiment includes an electromagnet 21 and a permanent magnet 22. The electromagnet 21 is an example of a third magnetic generator. The permanent magnet 22 is an example of a fourth magnetic generator.

The electromagnet 21 is attached onto the upper face of the top ring body 11 and disposed above an end portion 12a of the membrane 12 via the top ring body 11. The electromagnet 21 of the present embodiment has a ring shape similarly to the electromagnets 14.

The permanent magnet 22 is provided in the membrane 12 and disposed below the end portion 12a of the membrane 12. The permanent magnet 22 of the present embodiment has a ring shape similarly to the permanent magnets 15. Moreover, the permanent magnet 22 of the present embodiment is an elastic magnet such as a rubber magnet and can be deformed together with the membrane 12.

Sign $F_3$ denotes magnetic force acting between the electromagnet 21 and the permanent magnet 22. In the present embodiment, the end portion 12a of the membrane 12 is compressed or expanded with this magnetic force. The controller 10 (FIG. 1) can adjust a direction and a magnitude of the magnetic force by controlling a direction and a magnitude of a current applied to the electromagnet 21, and can adjust the pressing pressure of the end portion 12a with this magnetic force.

In general, the membrane 12 is hardly expanded more at the end portion 12a with the fluid pressure $F_1$ as compared with its center portion. Therefore, when the surface of the wafer 1 is polished in the present embodiment, repulsive force is caused to act on the end portion 12a of the membrane 12 as the magnetic force $F_3$. Thereby, the end portion 12a of the membrane 12 can be expanded similarly to the center portion thereof. Therefore, the present embodiment can improve the in-plane uniformity of the thickness of the film between the vicinity of the center portion and the vicinity of the end portion 12a.

The electromagnet 21 and the permanent magnet 22 of the present embodiment may be provided on the polishing head 2 of the second or third embodiment.

While certain embodiments have been described, these embodiments have been presented by way of example only, and are not intended to limit the scope of the inventions. Indeed, the novel heads, apparatuses and methods described herein may be embodied in a variety of other forms; furthermore, various omissions, substitutions and changes in the form of the heads, apparatuses and methods described herein may be made without departing from the spirit of the inventions. The accompanying claims and their equivalents are intended to cover such forms or modifications as would fall within the scope and spirit of the inventions.

The invention claimed is:

1. A polishing head comprising:
an elastic film configured to form pressure rooms to which a pressure fluid is fed, and configured to press a substrate onto a polishing surface by deforming the elastic film with a pressure of the pressure fluid, the pressure rooms being adjacent to each other in a first direction and expanding or contracting in a second direction that is perpendicular to the first direction due to the deformation of the elastic film;
a first magnetic generator provided above two of the pressure rooms and a partition wall that separates the two of the pressure rooms and outside the pressure rooms; and
a second magnetic generator configured to form at least a portion of the partition wall or provided below the partition wall, wherein the first magnetic generator is an electromagnet configured to adjust a direction and an intensity of magnetic force that acts between the first magnetic generator and the second magnetic generator, the second magnetic generator is a permanent magnet, a pressure that presses the substrate includes a first pressure depending on the pressure of the pressure fluid fed to the pressure rooms and a second pressure depending on the magnetic force, a magnitude of the first pressure being larger than a magnitude of the second pressure, and the elastic film comprises first portions that are positioned under the pressure rooms and a second portion that is positioned in a vicinity of the partition wall between the first portions, the first pressure mainly deforms the first portions out of the first and second portions, and the second pressure mainly acts to apply pressure to the second portion out of the first and second portions.

2. The head of claim 1, comprising a plurality of electromagnets as the first magnetic generator and a plurality of permanent magnets as the second magnetic generator, the plurality of permanent magnets having magnetizations oriented to a same direction.

3. The head of claim 1, wherein the second magnetic generator forms a portion of the partition wall and is provided below an elastic partition wall that forms another portion of the partition wall.

4. The head of claim 1, wherein the second magnetic generator is an elastic magnet forming the partition wall.

5. The head of claim 1, wherein the second magnetic generator is a rubber magnet provided in the elastic film below the partition wall.

6. The head of claim 1, further comprising:
a third magnetic generator provided above an end portion of the elastic film; and
a fourth magnetic generator provided below the end portion of the elastic film.

7. The head of claim 6, wherein the third magnetic generator is an electromagnet configured to control a direction and a magnitude of magnetic force acting between the third and fourth magnetic generators.

8. The head of claim 6, wherein the fourth magnetic generator is a permanent magnet.

9. The head of claim 1, wherein the partition wall, the first magnetic generator and the second magnetic generator have ring shapes.

10. The head of claim 1, further comprising a pressure room formation member configured to form the pressure rooms together with the elastic film, having holes for feeding the pressure fluid into the pressure rooms, and provided between the partition wall and the first magnetic generator.

11. A polishing apparatus comprising:
a polishing table configured to retain a polishing pad; and
a polishing head configured to retain a substrate to press the substrate onto a polishing surface of the polishing pad,
the polishing head comprising:
an elastic film configured to form pressure rooms to which a pressure fluid is fed, and configured to press the substrate onto the polishing surface by deforming the elastic film with a pressure of the pressure fluid, the pressure rooms being adjacent with each other in a first direction and expanding or contracting in a second direction that is perpendicular to the first direction due to the deformation of the elastic film;
a first magnetic generator provided above two of the pressure rooms and a partition wall that separates the two of the pressure rooms and outside the pressure rooms; and
a second magnetic generator configured to form at least a portion of the partition wall or provided below the partition wall,
wherein the first magnetic generator is an electromagnet configured to adjust a direction and an intensity of magnetic force that acts between the first magnetic generator and the second magnetic generator,
the second magnetic generator is a permanent magnet,
a pressure that presses the substrate includes a first pressure depending on the pressure of the pressure fluid fed to the pressure rooms and a second pressure depending on the magnetic force, a magnitude of the first pressure being larger than a magnitude of the second pressure, and
the elastic film comprises first portions that are positioned under the pressure rooms and a second portion that is positioned in a vicinity of the partition wall between the first portions, the first pressure mainly deforms the first portions out of the first and second portions, and the second pressure mainly acts to apply pressure to the second portion out of the first and second portions.

12. The apparatus of claim 11, further comprising a controller configured to press the substrate onto the polishing surface with the fluid pressure by feeding the pressure fluid into the pressure rooms, and configured to adjust a pressing pressure of the partition wall with magnetic force acting between the first and second magnetic generators.

13. The apparatus of claim 12, wherein the controller adjusts a direction and a magnitude of the magnetic force by controlling a current applied to the first magnetic generator that is an electromagnet.

14. The apparatus of claim 11, wherein the polishing head further comprises a pressure room formation member configured to form the pressure rooms together with the elastic film, having holes for feeding the pressure fluid into the pressure rooms, and provided between the partition wall and the first magnetic generator.

* * * * *